(12) United States Patent
Rotem

(10) Patent No.: US 9,236,336 B2
(45) Date of Patent: Jan. 12, 2016

(54) SYSTEMS AND METHODS FOR MITIGATION OF MECHANICAL DEGRADATION IN HIGH PERFORMANCE ELECTRICAL CIRCUIT PACKAGES

(71) Applicant: Marvell International Ltd., Hamilton (BM)

(72) Inventor: Eran Rotem, Haifa (IL)

(73) Assignee: MARVELL ISRAEL (M.I.S.L) LTD., Yokneam (IL)

( * ) Notice: Subject to any disclaimer, the term of this patent is extended or adjusted under 35 U.S.C. 154(b) by 22 days.

(21) Appl. No.: 13/939,797

(22) Filed: Jul. 11, 2013

(65) Prior Publication Data

US 2014/0015132 A1 Jan. 16, 2014

Related U.S. Application Data

(60) Provisional application No. 61/670,890, filed on Jul. 12, 2012.

(51) Int. Cl.
*H01L 23/50* (2006.01)
*H01L 23/498* (2006.01)
*H01L 21/768* (2006.01)

(52) U.S. Cl.
CPC .... *H01L 23/49816* (2013.01); *H01L 21/76885* (2013.01); *H01L 23/49822* (2013.01); *H01L 23/49827* (2013.01); *H01L 23/50* (2013.01); *H01L 2224/16225* (2013.01); *H01L 2224/32225* (2013.01); *H01L 2224/73204* (2013.01); *H01L 2924/15311* (2013.01)

(58) Field of Classification Search
CPC .......... H01L 2924/01079; H01L 2924/01029; H01L 2924/01078; H01L 2224/13099; H01L 2924/01013
See application file for complete search history.

(56) References Cited

U.S. PATENT DOCUMENTS

| | | | | |
|---|---|---|---|---|
| 5,175,397 A * | 12/1992 | Lindberg | | 174/250 |
| 6,392,164 B1 * | 5/2002 | Iwaki et al. | | 174/262 |
| 6,764,931 B2 * | 7/2004 | Iijima et al. | | 438/584 |
| 2004/0164389 A1 * | 8/2004 | Lee | | 257/686 |
| 2010/0097875 A1 * | 4/2010 | Vinke et al. | | 365/226 |
| 2010/0193959 A1 * | 8/2010 | Grygiel | | 257/773 |

* cited by examiner

*Primary Examiner* — Hoai V Pham
*Assistant Examiner* — Long Le

(57) ABSTRACT

Systems and methods are provided for an integrated circuit package. A plurality of electrical contacts are configured to provide a structure for electrically connecting the integrated circuit package to a printed circuit board. A package substrate includes at least one patterned metallic layer formed to electrically interconnect I/O contacts of an integrated circuit to the plurality of electrical contacts, and at least one generally uniform metallic layer having a plurality of voids that are respectively situated in axial alignment with corresponding ones of the electrical contacts, and one or more dielectric layers disposed between the plurality of electrical contacts and the metallic layers. Further, the package substrate includes a plurality of metallic elements disposed within the plurality of voids and electrically isolated from the generally uniform metallic layer, the metallic elements configured to reduce a physical size of respective voids without electrically contacting the generally uniform metallic layer.

14 Claims, 5 Drawing Sheets

BALL CONTACT GRID

POWER/GROUND LAYER

SYSTEMS AND METHODS FOR MITIGATION OF MECHANICAL DEGRADATION IN HIGH PERFORMANCE ELECTRICAL CIRCUIT PACKAGES

CROSS-REFERENCE TO RELATED APPLICATIONS

This application claims priority to U.S. Provisional Patent Application No. 61/670,890, filed Jul. 12, 2012, entitled "Avoiding Mechanical/Electrical Issues in Package Substrates." which is herein incorporated in its entirety.

FIELD

The technology described herein relates generally to integrated circuits and more particularly to the fabrication of integrated circuit packages.

BACKGROUND

Integrated circuit packages are often formed in a layered fashion, where layers of dielectric material are overlaid with a metallic material that is patterned to fabricate power, ground, and trace connections to connect an integrated circuit to a printed circuit board. Various components are formed in the metal pattern in close proximity within the integrated circuit package, which in some configurations results in unwanted electrical interaction among the components. Various mechanisms are formed in the metal pattern to mitigate the unwanted electrical interaction. At times some combinations of components and mechanisms result in a mechanical weakness of the integrated circuit package.

The description above is presented as a general overview of related art in this field and should not be construed as an admission that any of the information it contains constitutes prior art against the present patent application.

SUMMARY

Examples of systems and methods are provided for an integrated circuit package. A plurality of electrical contacts are configured to provide a structure for electrically connecting the integrated circuit package to a printed circuit board. A package substrate includes at least one patterned metallic layer formed to electrically interconnect I/O contacts of an integrated circuit to the plurality of electrical contacts, and at least one generally uniform metallic layer having a plurality of voids that are respectively situated in axial alignment with corresponding ones of the electrical contacts. The package substrate further includes one or more dielectric layers disposed between the plurality of electrical contacts and the metallic layers. Further, the package substrate includes a plurality of metallic elements disposed within the plurality of voids and electrically isolated from the generally uniform metallic layer, the metallic elements configured to reduce a physical size of respective voids without electrically contacting the generally uniform metallic layer.

As another example, a method of fabricating an integrated circuit package includes depositing a metallic layer on one or more dielectric layers of an integrated circuit package substrate material. Portions of the metallic layer designated to be a power plane or a ground plane are removed so as to define a plurality of voids and a plurality of metallic elements in the power plane or the ground plane, ones of the plurality of elements being coaxially disposed within corresponding ones of the plurality of voids and electrically isolated from the power plane or the ground plane. A plurality of electrical contacts are fabricated on an external surface of the one or more dielectric layers for electrically connecting the integrated circuit package to a printed circuit board, the plurality of electrical contacts situated to be in axial alignment with a corresponding void in the power plane or ground plane of the fabricated integrated circuit package.

DETAILED DESCRIPTION

Figure 1:
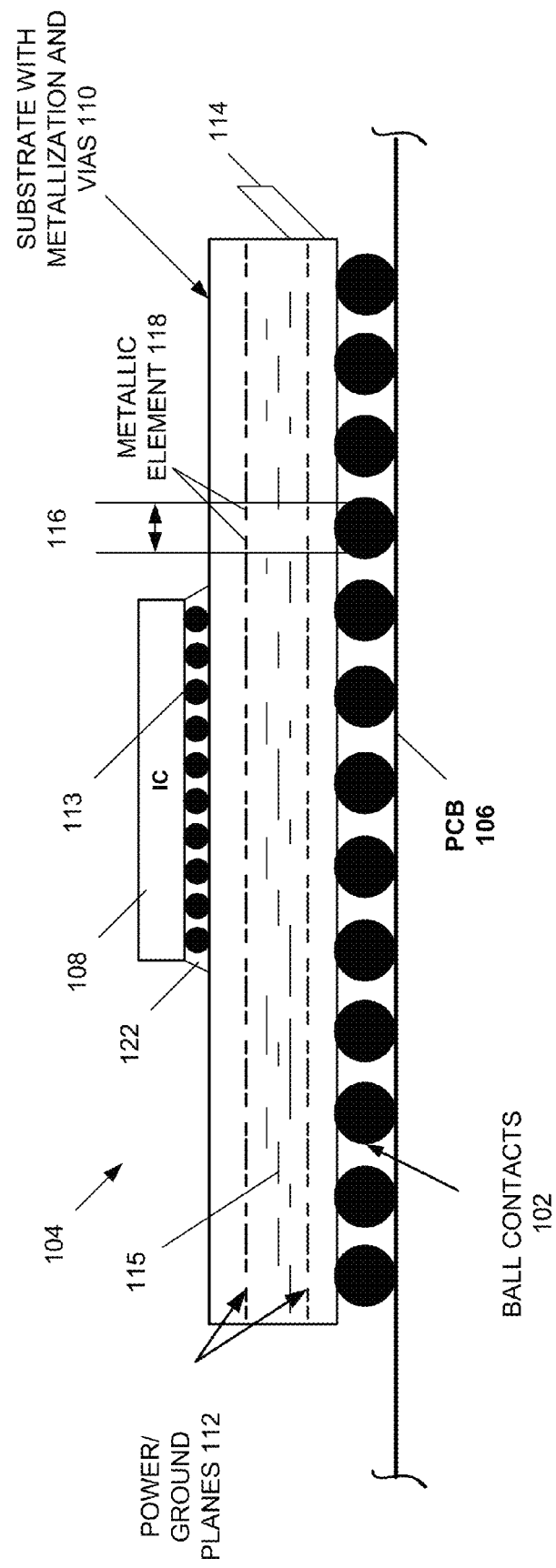
FIG. 1 is a block diagram depicting a side view of an integrated circuit package.

FIG. 1 is a block diagram depicting a side view of an integrated circuit package. The integrated circuit package includes a plurality of electrical contacts 102 that are configured to provide a structure for electrically connecting an integrated circuit package 104 to a printed circuit board 106. The example of FIG. 1 depicts a flip chip integrated circuit implementation where an integrated circuit 108 is connected to a package substrate 110 that is configured for connection to a printed circuit board 106 via a two dimensional array (illustrated in FIG. 2) of electrical contacts 102 in the form of ball contacts formed on a bottom side of the package substrate 110. The substrate 110 includes one or more metallic layers 112. In one embodiment of the disclosure, these layers/planes 112 take the form of power planes and ground planes as well as other layers that contain metallic intra-layer traces 115. Connection pins 113, such as flip chip bumps, of the integrated circuit 108 are connected to the package substrate 110 and further to the power plane to access electrical power. Additionally, other integrated circuit 108 connection pins 113 are connected to the package substrate 110 and further to the ground plane to provide access to a ground potential. One or more dielectric layers 114 are included between the plurality of electrical contacts 102 of the integrated circuit substrate 110 and the metallic layers 112. In one embodiment of the disclosure, the dielectric layers are provided and then the metallic layers are formed on top of the previously provided dielectric layers. Connections on a same layer of the integrated circuit substrate 110 are connected via intra-layer traces 115 while connections between layers are accomplished using inter-layer vias (not depicted), where such connections are used to connect the integrated circuit 108 to the printed circuit board 106.

Two charged conductors separated by a dielectric form a capacitor. Unintentionally formed capacitors introduce parasitic capacitances and cross talk interference that degrade performance of the integrated circuit package 104. Such unintentional capacitors are formed between metallic electrical contacts 102 and the metallic power/ground plane layers 112 in certain implementations. To combat these unwanted capacitances, the metallic layers 112 are formed with voids 116 or holes positioned above respective electrical contacts 102. In one embodiment of the disclosure, these voids 116 are sized to match the width of the electrical contacts 102. In other embodiments of the disclosure, the voids 116 are sized of greater or lesser width than the electrical contacts 102. In certain embodiments of the disclosure, vias for making connections across different layers of the integrated circuit substrate 110 or to external electrical connections 102 are included in the package substrate 116.

In accordance with an embodiment, the metallic layers 112 of the integrated circuit package 104 include a plurality of ring elements 118 that are respectively disposed within a plurality of voids 116 to provide certain structural benefits to the package 104 over packages lacking such ring elements 118. The metallic layers 112, which often span substantially the entire area of the substrate 110 are generally uniform metallic layers, in other words metallic layers which do not include patterns of traces, that provide a portion of the support structure of the integrated circuit package 104. Numerous, relatively large voids 116 in the metallic layers will typically negatively impact the structural integrity of the package substrate. In one embodiment of the disclosure, the metallic layers 112 have ring elements 118 that increase the mechanical strength, such as strength against shearing forces, of the integrated circuit package 104 and provide resistance to cracks and breakage from outside physical forces as well as failures related to usage cycle material fatigue over metallic layers 112 having a large number of voids 116 without the ring elements 118.

In one embodiment of the disclosure, a suitable metallic element 118, such as a ring or a disk, is fabricated within each of the metallic layer voids 116. Such metallic elements 118 are formed so as to reduce a size of the respective voids without electrically contacting the metal layer 112. Because the metallic elements 118 are not electrically connected to the metallic layers 112, the metallic elements 118 do not substantially impact the ability of the corresponding voids to reduce undesirable passive capacitance with the electrical contacts 102. However, the additional metal of the metallic elements 118 in the same plane as the metallic layers 112 provides additional structural integrity to the metallic layers 112 and added structural benefit to the integrated circuit package 104. In the example embodiment of FIG. 1, shown as a cross-sectional view, the metallic elements 118 take the form of rings 118 positioned within the metallic layer voids 116.

The example of FIG. 1 depicts an integrated circuit package fashioned using a flip chip semiconductor fabrication method. Other embodiments of the disclosure (not shown) utilize other suitable semiconductor-package interconnection techniques such as wire bonding. In one embodiment of the disclosure, a flip chip integrated circuit package is produced by adhering a plurality of layers of differing materials, such as metal layers and semiconductor layers. Each layer is patterned using a patterning process such as etching, ablation, or direct printing of circuit patterns, for example. In an etching process, a layer of conductive material, such as a metallic layer, is added to a package substrate. In an embodiment, a protective material is applied over the layer and is patterned, for example by exposing the protective material using an exposure and development process or by directly printing a protective mask in a desired pattern, to protect portions of the layer that are desired to remain after the etching process. An etching chemical, such as a suitable acid, is then applied to the layer to selectably remove portions of the metallic layer not protected by the mask. The mask is then stripped and the process is repeated for a next layer. In an ablation process, a conductive layer, such as a metallic layer, is applied to a dielectric substrate. Portions of the conductive layer that are desired to be removed are selectively removed via ablation using an ablating instrument, such as a laser.

Figure 2:
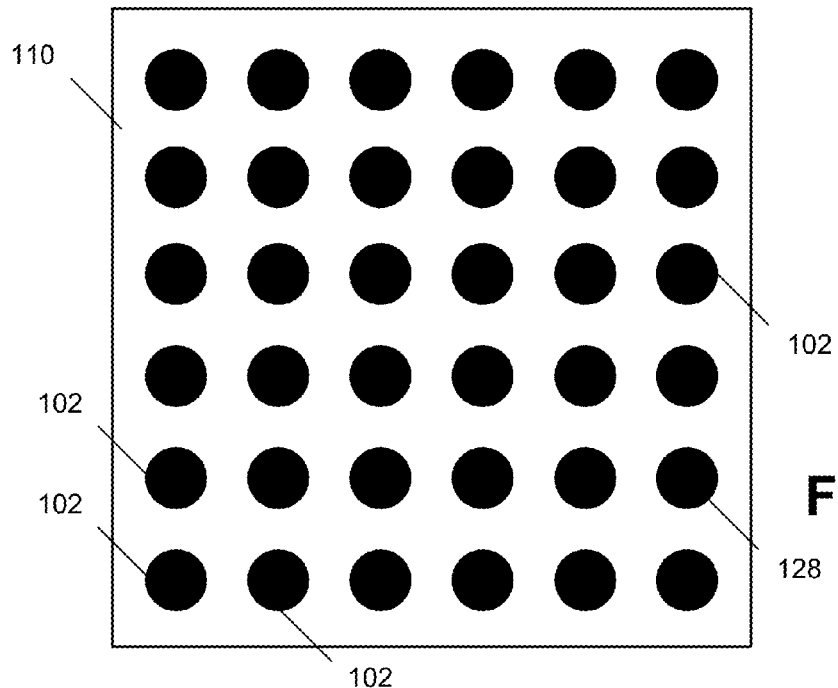
FIG. 2 is a bottom view of a package substrate prior to connection to a printed circuit board.

In the example integrated circuit package of FIG. 1, a two dimensional array of conductors, such as solder balls 102 are deposited on suitable contacts located at an external surface of the substrate. FIG. 2 is a bottom view of a substrate prior to connection to a printed circuit board. A conductive ball 102 is fabricated at each of a plurality of contact points, such as by depositing a ball of solder on each of the contact points, to form a two dimensional array of ball contacts 102. With reference back to FIG. 1, the substrate 110 is positioned on the printed circuit board 106, such that the ball contacts 102 are in contact with corresponding printed circuit board contact points. The solder ball contacts 102 are then remelted, such as via a thermosonic bonding process or hot air reflow, to connect the substrate 110 to the printed circuit board 106 with the appropriate electrical connections being made.

Figure 3:
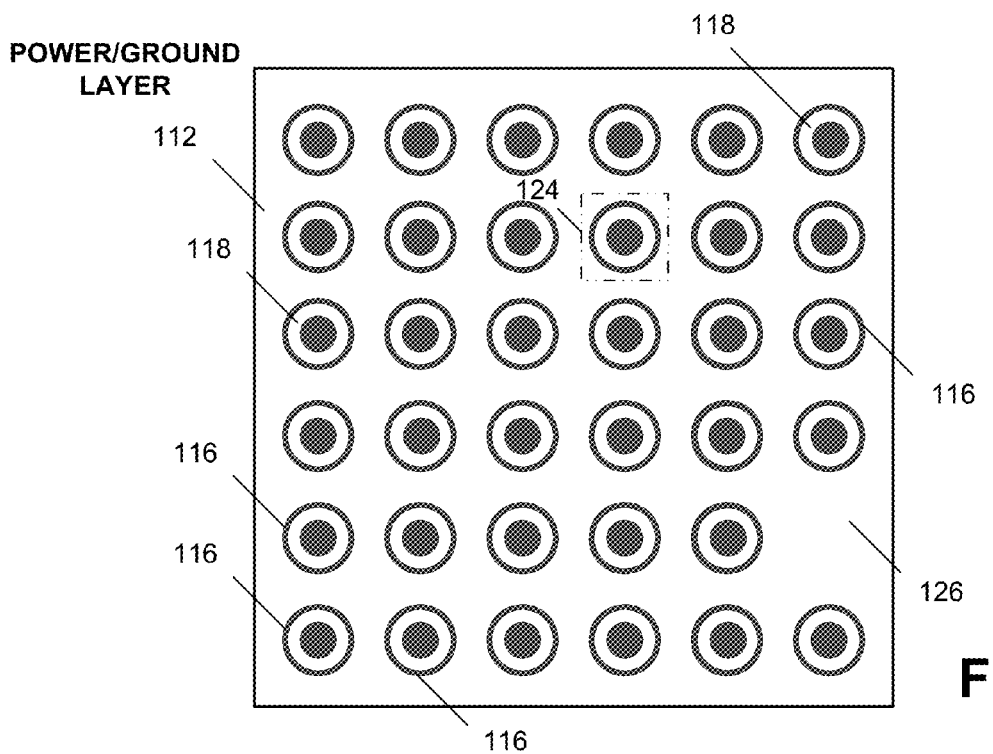
FIG. 3 is a diagram depicting a top view of a package power/ground plane in accordance with an embodiment of the disclosure.

FIG. 3 is a diagram depicting a top view of a power/ground plane in accordance with an embodiment of the disclosure. The power/ground planes comprise a generally uniform metallic layer 112, in other words a metallic layer that is not patterned to include electronic components such as traces, capacitors, and/or inductors, that spans all or most of an area of the integrated circuit substrate. Integrated circuit substrate elements and external connections are connected to a power plane or a ground plane via circuit traces and vias for access to the desired electrical potentials. A plurality of voids 116 are formed in the generally uniform metallic layer 112, the voids 116 corresponding to the positions of the solder ball electrical contacts 102, depicted in FIG. 2, which are positioned at the bottom of the integrated circuit package substrate 110, that is the plurality of voids are respectively situated in axial alignment with corresponding ones of the electrical contacts 102. The voids 116 provide areas of non-conductivity in the metallic layer 112 which help mitigate unwanted parasitic capacitances between the electrical contacts 102 and the metallic layer 112, in an embodiment.

As noted above, the structural integrity of package substrates is negatively impacted by numerous voids 116 in metallic layers 112. In an embodiment of the disclosure, electrically isolated, metallic elements 118 are provided within the voids 116 to add additional structural stability to the integrated circuit package. Because the metallic elements 118 are physically and electrically isolated from the metallic layer 112, the metallic elements 118 do not contribute to unwanted conductive capacitances of the metal layer 112 with the electrical connection ball contacts 102 that are positioned underneath the voids 116. However, the additional metal of the metallic elements 118, that is coplanar with the metallic layer 112, provides additional structural support that serves to mitigate mechanical weakness exhibited in substrates having numerous voids.

Figure 4A:
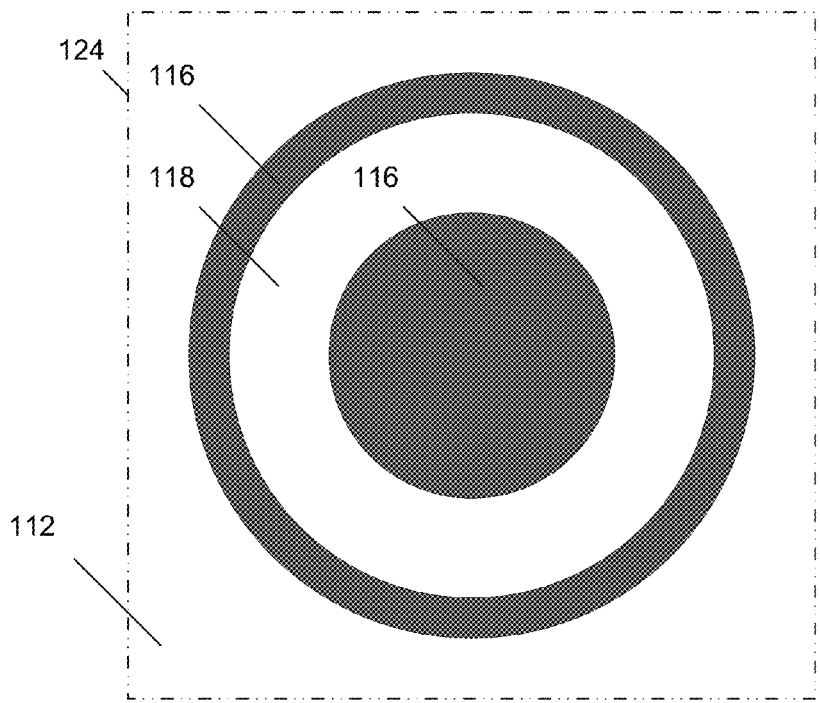
FIG. 4A provides a close up view of a metallic layer void having a metallic ring disposed therein.

In the example of FIG. 3, the metallic elements 118 suitably take the shape of metallic rings formed within the metallic layer 112 voids 116. Other suitable shapes may be appropriate. FIG. 4A provides a close up view of area 124 of a generally uniform metallic layer 112 having a plurality of voids 116 with a corresponding plurality of metallic rings 118 disposed therein. The void 116 is depicted as the grey area that is removed, for example by etching, from the metallic layer 112. The metallic ring 118 is positioned coaxially within the void 116 such that the metallic ring 118 is physically and electrically isolated from the metallic layer 112 while providing mechanical support to the metallic layer 112 and the package substrate.

In one embodiment of the disclosure, the void 116 and the metallic ring 118 are formed via an etching process. In that process, the metallic layer 112 is deposited on the integrated circuit package substrate as a contiguous layer. A masking material is selectively applied to (and/or removed from) the metallic layer 112 so that the portions of the metallic layer 112 depicted in FIG. 4A in white are covered, while the grey portions are left uncovered. An etching chemical is applied to the masked metallic layer, such that the metal (e.g., copper), which has not been covered by the mask, is dissolved and subsequently the remaining mask is stripped from the substrate in a stripping operation. The remaining portions of the metal layer 112 thereby include the generally uniform metallic portion 112, with void areas 116 formed therein, and electrically isolated metal rings 118 disposed in the void areas 116.

In another embodiment of the disclosure, the metallic layer 112 is deposited in a solid layer, and the grey void portions 116 of the metallic layer 112 are ablated away using a laser or another ablation instrument. In a further embodiment of the disclosure, circular voids are removed from a solid metallic layer via etching, ablation, or another fabrication procedure, and the metallic ring is then incorporated into the metal layer within the circular voids via a second metal depositing step. In other embodiments, other methodologies for forming the metallic layer are used. For example, in one embodiment of the disclosure, the metal portions of the metallic layer are directly printed onto a dielectric layer in a desired pattern using an ink-jet or other suitable printing type process.

Figure 4B:
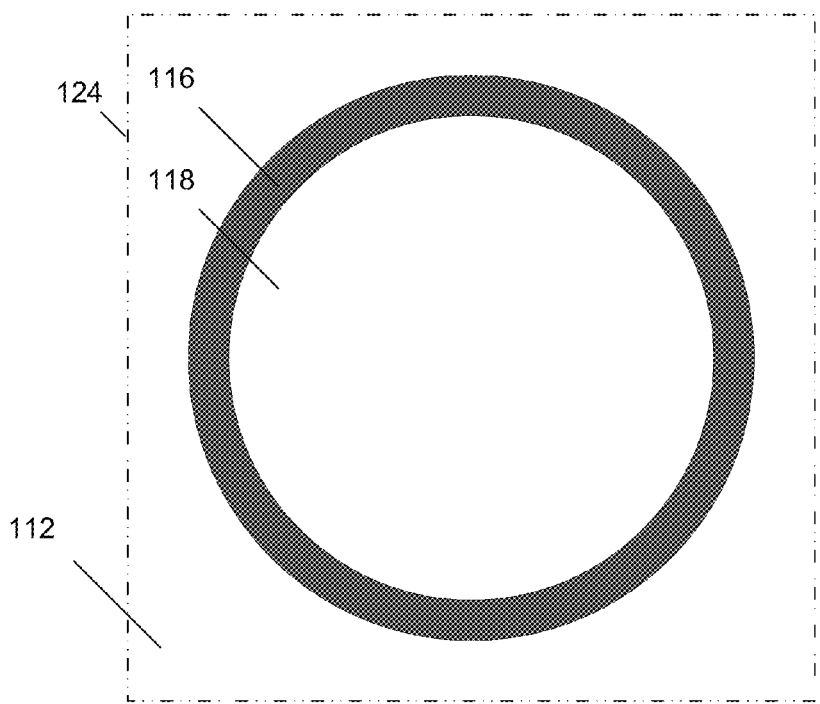
FIG. 4B provides a close up view of a metallic layer void having a metallic disk disposed therein.

In another embodiment of the disclosure, the metallic element 118 is formed as a solid disk. FIG. 4B provides a close up view of area 124 of a metallic layer 112 void 116 having a metallic disk disposed therein. The embodiment of FIG. 4B is generated using similar methods as described with reference to FIG. 4A. For example, a generally uniform metallic layer 112 that spans all or most of an area of a substrate of an integrated circuit or integrated circuit package is deposited, and the grey void portion 116 of the metallic layer 112 is removed, such as via etching or ablation. The portion remaining is the generally uniform metallic layer 112 that is, for example, connected to a power or ground contact of a printed circuit board though a electric contact, as well as the metallic disk 118 that enhances mechanical strength of an integrated circuit package device, relative to other devices having voids 116 without the metallic disk 118 without unwanted capacitive interference with external electric contacts to the integrated circuit device. In certain embodiments of the disclosure, the metallic elements 118 take the form of other shapes including non-circular shapes, such as triangles, quadrilaterals, or other multi-sided polygons.

With reference back to FIG. 3, in one embodiment of the disclosure, one or more positions 126 in the metallic layer 112 that corresponds with an electrical contact 102 does not include a void. In other words, in some embodiments, a void is not formed in the metallic layer 112 for every single ball contact 102. In one embodiment of the disclosure, this position 126 corresponds with a connection between the corresponding electrical contact 128 (FIG. 2) and the metallic layer 112. In one example, the corresponding electrical contact 128 is a ground contact, and the metallic layer 112 is a ground plane, where the ground contact 128 is connected to the ground plane 112 at position 126 using a via through intervening layers of semiconductor material.

Figure 5:
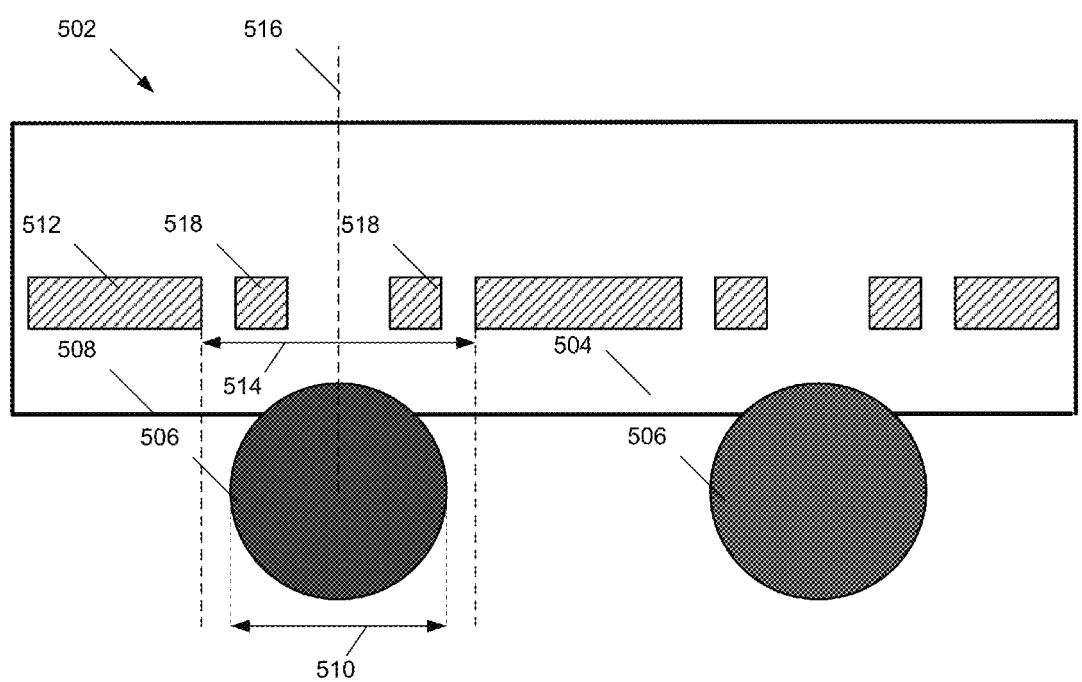
FIG. 5 is a cross-sectional view of a metallic layer having voids and metallic elements positioned on axis with electrical contacts of an integrated circuit substrate.

FIG. 5 is a cross-sectional view of a metallic layer having voids and metallic elements positioned in axial alignment with electrical contacts of an integrated circuit substrate. A package substrate 502 includes a plurality of layers, where certain ones of those layers are depicted in FIG. 5. One or more bottom layers 504 are formed from a suitable substrate material, such as a dielectric. A plurality of electrical contacts 506 (e.g., solder ball contacts) are deposited on a bottom face 508 of the package substrate 502 for making electrical contact between the package substrate 502 and another entity, such as a printed circuit board. Each of the electrical contacts 506 is of a particular width 510. A metallic layer 512 is positioned as one of the layers in the package substrate 502. In one embodiment of the disclosure, the metallic layer 512 forms a power layer, to which traces and vias within the integrated circuit are connected for access to the power potential. The metallic layer 512 includes a void 514 positioned corresponding to each of the depicted electrical contacts 506. The voids 514 are positioned in axial alignment with the electrical contacts 506, as indicated at axis 516. The width of the void 514, in the embodiment of FIG. 5, is greater than the width 510 of the electrical contact 506, although in other embodiments width of void 514 is less than or equal to the width 510 of electrical contact 506. In general, the greater width of the void 514 decreases unwanted electrical interference from interactions between the electrical contacts 506 and the metal layer 512. A metallic element 518 that is electrically isolated from the metallic layer 512 is positioned within the void 514 to add mechanical integrity and structural stability to the package substrate 502 and ultimately the integrated circuit package. The example of FIG. 5 depicts a cross section of a metallic ring 518 that is disposed within the void 514, where the metallic ring 518 is positioned in axial alignment with the electrical contact 506. The metallic ring 518 is configured to reduce an effective size of the void 514 without electrically coupling to the metallic layer 512 so as to have an electrical potential that is independent of the metallic layer 512.

In an embodiment of the disclosure, additional layers are added to the integrated circuit substrate of FIG. 5, where those additional layers include one or more additional metallic layers that include voids and corresponding metallic elements within the voids. For example, where the generally uniform metallic layer 512 of FIG. 5 is a power plane for the integrated circuit substrate 502, a second generally uniform metallic layer including a plurality of voids is formed as a ground plane for the integrated circuit substrate. The voids of the second metallic layer are also respectively positioned in axial alignment with corresponding ones of the electrical contacts 506, where the second metallic layer voids include a plurality of metallic elements disposed therein that are electrically and physically isolated from the second metallic layer. The metallic elements, such as metallic rings, of the second metallic layer are configured to reduce a size of respective voids without electrically contacting the second metallic layer.

Figure 6:
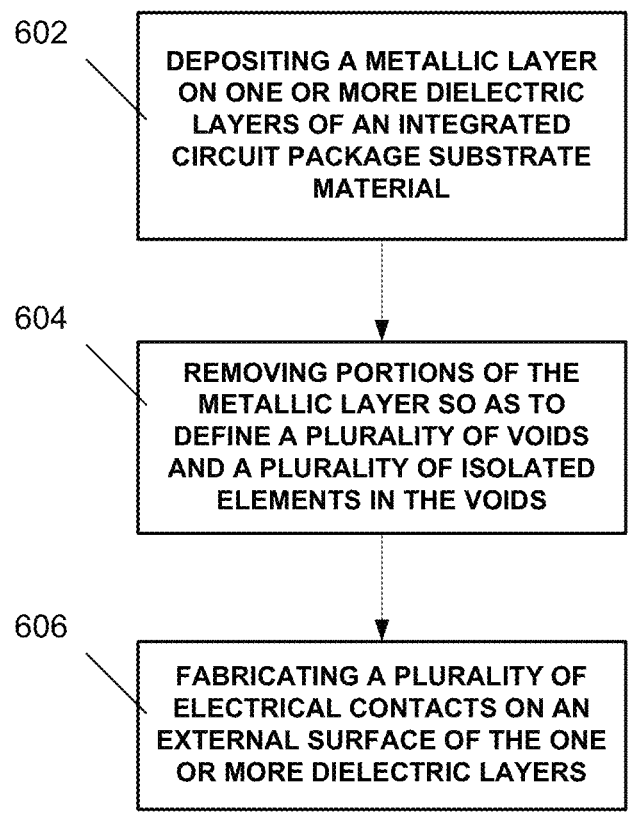
FIG. 6 is a flow diagram depicting a method of fabricating an integrated circuit package.

FIG. 6 is a flow diagram depicting a method of fabricating an integrated circuit package. At 602, a metallic layer is deposited on one or more dielectric layers of an integrated circuit package substrate material. Portions of the metallic layer, which is designated to be a power plane or a ground plane, in an embodiment, are selectively removed at 604 so as to define a plurality of voids and a plurality of metallic isolated elements in the voids of the power plane or the ground plane. Ones of the plurality of metallic isolated elements being coaxially disposed within corresponding ones of the plurality of voids and electrically isolated from the power plane or the ground plane. A plurality of electrical contacts, such as ball contacts, are fabricated on an external surface of the one or more dielectric layers for electrically connecting the integrated circuit package to a printed circuit board, the plurality of electrical contacts situated to be in axial alignment with a corresponding void in the power plane and/or ground plane of the fabricated integrated circuit package.

This application uses examples to illustrate the invention. The patentable scope of the invention includes other examples.

What is claimed is:

1. An integrated circuit package, comprising:
  a plurality of electrical contacts configured to provide a structure for electrically connecting the integrated circuit package to a printed circuit board; and
  a package substrate, including:
    at least one patterned metallic layer formed to electrically interconnect I/O contacts of an integrated circuit to the plurality of electrical contacts, and at least one generally uniform metallic layer having a plurality of voids that are respectively situated in axial alignment with corresponding ones of the electrical contacts;
    one or more dielectric layers disposed between the plurality of electrical contacts and the at least one generally uniform metallic layer; and
    a plurality of metallic elements disposed within the plurality of voids, each metallic element being electrically isolated from (i) all other portions of the integrated circuit package, and (ii) all portions of the printed circuit board, the plurality of metallic elements being coplanar with the generally uniform metallic layer, the metallic elements being dimensioned to reduce a physical size of respective voids without electrically contacting the generally uniform metallic layer.

2. The integrated circuit package of claim 1, wherein the plurality of metallic elements are of ring shape.

3. The integrated circuit package of claim 1, wherein the plurality of electrical contacts include an array of ball contacts.

4. The integrated circuit package of claim 1, wherein the generally uniform metallic layer and the plurality of metallic elements are formed from a single metallic layer that is deposited on one of the dielectric layers.

5. The integrated circuit package of claim 4, wherein a first void portion of a first size is formed in the generally uniform metallic layer by ablation or etching so as to be situated in the substrate in axial alignment with a corresponding electrical contact, and a metallic element in an isolation ring form, coaxially situated with the first void portion and having a center to edge distance smaller than first void portion, is formed in the generally uniform metallic layer by ablation or etching to define an intra-void ring element that is electrically isolated from the generally uniform metallic layer.

6. The integrated circuit package of claim 1, wherein the generally uniform metallic layer forms one of a ground plane or a power plane for the integrated circuit package.

7. The integrated circuit package of claim 1, wherein the at least one generally uniform metallic layer is a first generally uniform metallic layer, the integrated circuit package further comprising:
  a second generally uniform metallic layer having a plurality of second voids that are respectively situated in axial alignment with corresponding ones of the electrical contacts, the plurality of second voids being respectively situated in axial alignment with corresponding voids of the first generally uniform metallic layer, each of the second voids having a size that is equal to that of a corresponding void of the first generally uniform metallic layer; and
  a plurality of second metallic elements disposed within the plurality of second voids, each second metallic element being electrically isolated from (i) all other portions of the integrated circuit package, and (ii) all portions of the printed circuit board, the plurality of second metallic elements being coplanar with the second generally uniform metallic layer, the second metallic elements configured to reduce a physical size of respective second voids without electrically contacting the second generally uniform metallic layer.

8. The integrated circuit package of claim 7, wherein the first generally uniform metallic layer forms a power plane, and wherein the second generally uniform metallic layer forms a ground plane of the integrated circuit package.

9. The integrated circuit package of claim 1, wherein the plurality of metallic elements increase a strength of the integrated circuit package against shear stress over a second integrated circuit package that lacks the plurality of metal elements.

10. The integrated circuit package of claim 1, further comprising:
  a plurality of metalized vias passing through two or more dielectric layers.

11. The integrated circuit package of claim 1, further comprising a second dielectric layer disposed on top of the generally uniform metallic layer; and
  an integrated circuit, wherein the second dielectric layer is positioned between the integrated circuit and the metallic layer.

12. The integrated circuit package of claim 1, wherein the electrical contacts are ball contacts, each ball contact having a diameter, and wherein each of the voids has a circular shape with a diameter that is equal to that of a corresponding one of the ball contacts.

13. The integrated circuit package of claim 1, wherein the electrical contacts are ball contacts, each ball contact having a diameter, and wherein each of the voids has a circular shape with a diameter that is less than or equal to that of a corresponding one of the ball contacts.

14. The integrated circuit package of claim 1, wherein for each electrical contact of the plurality of electrical contacts, a void of the plurality of voids is situated in axial alignment with the electrical contact.

* * * * *